United States Patent
Kroener et al.

(10) Patent No.: US 11,794,602 B2
(45) Date of Patent: Oct. 24, 2023

(54) METHOD AND DEVICE FOR IMPROVING THE SERVICE LIFE OF AN EQUIPMENT BATTERY IN A BATTERY-OPERATED MACHINE IN A MACHINE-SPECIFIC MANNER

(71) Applicant: Robert Bosch GmbH, Stuttgart (DE)

(72) Inventors: Christoph Kroener, Rosstal (DE); Christian Simonis, Leonberg (DE); Christoph Woll, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/550,624

(22) Filed: Dec. 14, 2021

(65) Prior Publication Data

US 2022/0185139 A1   Jun. 16, 2022

(30) Foreign Application Priority Data

Dec. 15, 2020 (DE) .................... 10 2020 215 864.9

(51) Int. Cl.
| | |
|---|---|
| *G01R 31/36* | (2020.01) |
| *B60L 53/66* | (2019.01) |
| *H02J 7/00* | (2006.01) |
| *H01M 10/44* | (2006.01) |
| *B60L 58/13* | (2019.01) |
| *H01M 10/42* | (2006.01) |
| *G01R 31/382* | (2019.01) |
| *G01R 31/392* | (2019.01) |
| *G01R 31/367* | (2019.01) |

(52) U.S. Cl.
CPC ............. *B60L 53/66* (2019.02); *B60L 58/13* (2019.02); *H01M 10/441* (2013.01); *H02J 7/005* (2020.01); *H02J 7/0049* (2020.01); *G01R 31/367* (2019.01); *G01R 31/382* (2019.01); *G01R 31/392* (2019.01); *H01M 2010/4271* (2013.01)

(58) Field of Classification Search
CPC .. G01R 31/364; G01R 31/367; G01R 31/382; G01R 31/392; B60L 53/66; B60L 58/13; H02J 7/005; H02J 7/0049; H01M 10/441; H01M 2010/4271
See application file for complete search history.

(56) References Cited

U.S. PATENT DOCUMENTS

| | | | |
|---|---|---|---|
| 8,519,674 B2* | 8/2013 | Anderson ............ | G01R 31/392 320/132 |
| 2015/0226808 A1* | 8/2015 | Doerr .................... | H01M 10/00 702/63 |

FOREIGN PATENT DOCUMENTS

DE   10 2012 214 877 A1   2/2014

OTHER PUBLICATIONS

Park, S. et al., "Data-driven State-of-health Estimation of EV batteries Using Fatigue Features", 2016 IEEE International Conference on Consumer Electronics (ICCE), 2016, pp. 101-102.

* cited by examiner

*Primary Examiner* — Gonzalo Laguarda
(74) *Attorney, Agent, or Firm* — Maginot, Moore & Beck LLP

(57) ABSTRACT

The disclosure relates to a computer-implemented method for operating a system comprising a central processing unit, which is in communication with a multiplicity of battery-operated machines that each have an equipment battery, and for providing an action for extending the service life of the equipment battery of the machine in a machine-specific manner.

20 Claims, 5 Drawing Sheets

METHOD AND DEVICE FOR IMPROVING THE SERVICE LIFE OF AN EQUIPMENT BATTERY IN A BATTERY-OPERATED MACHINE IN A MACHINE-SPECIFIC MANNER

This application claims priority under 35 U.S.C. § 119 to application no. DE 10 2020 215 864.9, filed on Dec. 15, 2020 in Germany, the disclosure of which is incorporated herein by reference in its entirety.

TECHNICAL FIELD

The disclosure relates to battery-operated machines, in particular electric vehicles or hybrid vehicles, and further to energy storage management methods and systems having functions for extending a service life of a battery.

BACKGROUND

Battery-operated machines are supplied with energy by means of an electrical energy storage device, which usually comprises a battery. The state of health of the battery changes noticeably in the course of its service life, which results in a decreasing storage capacity. A measure of the ageing depends on stress factors that result from the way the battery is used. The individual load on the battery depends on the type of machine and/or the usage behavior of a user and correspondingly affects the progression of the state of health in a machine-specific manner.

A variable that is of interest for the user is the remaining service life of the battery, which can be determined from the current state of health. This information enables the user to plan battery replacement in the longer term, or to take preventive actions to extend the life of the battery.

Furthermore, although manufacturers provide a service-life guarantee for batteries, this may not be met because of correspondingly stress-inducing usage of the battery.

It is therefore desirable to influence the usage of the battery in order to increase its service life if particular stress factors are apparent, or possibly if non-compliance with the service life guarantee is foreseeable.

SUMMARY

Provided according to the disclosure are a method for operating a system comprising a central processing unit in communication with a multiplicity of battery-operated machines that each have an equipment battery, and for providing an action for extending the service life of the equipment battery of the machine in a machine-specific manner, and a device and a system comprising a central processing unit and comprising a multiplicity of machines.

Further designs are specified in the embodiments.

Provided according to a first aspect is a computer-implemented method for operating a system comprising a central processing unit, which is in communication with a multiplicity of battery-operated machines that each have an equipment battery, and for providing an action for extending the service life of the equipment battery of the machine in a machine-specific manner, comprising the following steps:

- determining in each case a history function of the state of health in dependence on time progressions of continuously provided, or received, operating variables for a multiplicity of particular equipment batteries, the respective history function indicating a progression of the state of health of the respective equipment battery,
- providing operating attributes in dependence on the time progressions of the continuously provided, or received, operating variables for each of the equipment batteries, the provided operating attributes being assigned to possible stress factors for the purpose of indicating a stress load,
- performing a cluster analysis for at least one of the operating attributes in an attribute space having operating attribute points that are each determined by the relevant operating attribute and by a respective function parameter of the history function that indicates a measure of the degradation, in particular a time gradient, for each of the equipment batteries, in order to identify a plurality of clusters of equipment batteries,
- for each operating attribute, identifying the cluster of equipment batteries for which the relevant operating attribute of the centroid associated with the relevant cluster indicates the highest stress load and for which the function parameter of the centroid associated with the relevant cluster indicates the highest degradation among the clusters,
- for each operating attribute, signaling to the machines associated with the identified cluster a stress-reducing action assigned to the relevant operating attribute.

According to one embodiment, the determining of a history function of the state of health in dependence on continuously provided operating variables of the particular equipment battery may comprise the steps of:

- ascertaining state-of-health values of the equipment battery, in dependence on the provided operating variables, with the aid of a state-of-health model in order to determine data points, a data point assigning an ascertained state-of-health value to an ageing time-point,
- parameterizing the history function in order to fit the history function to the data points.

The state of health of a battery is usually not measured directly. This would require a series of sensors in the battery, which would make the production of such a battery expensive and increase the amount of space required. In addition, automotive-grade methods for determining the state of health in the machine are not yet available for real operation. The current state of health is therefore usually determined with the aid of a physical or empirical ageing model in the machine. This physical state-of-health model has worst-case model deviations of more than 5%. Due to the inaccuracy of the physical ageing model, it can also only indicate the instantaneous state of health of the battery. A prediction of the state of health, which depends in particular on the manner of operation of the battery such as, for example, the level and quantity of the charge inflow and charge outflow, and thus on an operating behavior and on machine parameters, would result in very inaccurate predictions and is not currently provided in the machine.

The state of health (SOH) is the key variable for indicating a remaining battery capacity or a remaining battery charge. The state of health may be expressed a capacity retention rate (SOH-C) or as an increase in the internal resistance (SOH-R). The capacity retention rate SOH-C is expressed as the ratio of the measured instantaneous capacity to an initial capacity of the fully charged equipment battery. The relative change in the internal resistance SOH-R increases as the equipment battery ages.

The above method, by analyzing fleet data of a multiplicity of equipment batteries in dependence on a user-specific operation of the machine, or of the equipment battery, for the ascertainment of operating attributes that represent stress factors and that consequently greatly influence the ageing, or degradation, of the equipment battery. This makes it possible to ascertain actions, in dependence on identified stress factors, by which the ageing/degradation of the equipment battery can be slowed down as far as possible in order thus to extend the remaining service life of the equipment battery.

Stress factors within the meaning of this description represent predefined operating attributes that stress the equipment battery and cause it to age more intensively. The operating attributes that can correspond to stress factors characterize usage patterns that indicate typical machine-specific or usage-specific behavior. Stress factors are defined in advance, such as, for example, the stress factor of high calendar ageing with a high state of charge and high temperature, a high cyclic ageing corresponding to a high frequency of charging and discharging processes, and a frequency of fast charging processes with high amperages. Stress factors are therefore based on known effect chains for ageing and can be quantified.

In particular, it is difficult to specify a guarantee for the service life of an equipment battery without taking into account user-specific stress factors. For example, users can stress the battery to a greater or lesser extent through different usage behaviors, which significantly affects the ageing of the battery. A specified guarantee such as, for example, a drop in the state of health to 80% of the original capacity at the time of installation within a certain period of time, for example eight years, can thus only be given with reservations.

The above method, by ascertaining a presence of relevant stress factors and providing for certain actions, makes it possible to extend the service life of the multiplicity of equipment batteries. In particular, a suitable action for extending the service life of the relevant equipment battery can be suggested to a user of a battery-operated machine.

This is especially the case for unknown battery types for which no information on electrochemical design parameters or extensive ageing tests are available, and no electrochemical or hybrid, or data-based, model can be parameterized. The stress factors are ascertained by consideration of state-of-health progressions of the multiplicity of equipment batteries with the aid of a cluster method.

For this purpose, one or more operating attributes of the equipment batteries that characterize the usage, or operating behavior, of the equipment batteries are ascertained as potential stress factors. In addition, a progression of the state of health is approximated with the aid of a preferably linear history function. This history function may be non-linear or linear. In the linear case, a time gradient of the state of health of the relevant equipment battery can be obtained. In the general non-linear case, there is accordingly obtained a function parameter that can indicate a measure of the degradation (speed of ageing, or a gradient of the ageing progression). The state of health is preferably determined with the aid of conventional empirical methods such as, for example, Coulomb counting or a measurement of a change in internal resistance in certain operating states of the equipment battery such as, for example, a charging process, a discharging process or the like.

The obtained function parameter of the history function, or the state-of-health progression, such as, for example, the time gradient, as well as one of the predefined operating attributes that can be considered as possible stress factors, in each case form an attribute space for operating attribute points, an operating attribute point being in each case determined by the relevant operating attribute and the function parameter for a corresponding equipment battery.

A cluster analysis is performed, based on the distribution of the operating attribute points of the multiplicity of equipment batteries in the attribute space. The cluster analysis yields clusters, each of which is determined by the associated centroid. Each centroid is associated with a quantified operating attribute and a value of the function parameter indicating a measure of a degradation. The cluster analysis, which may use, for example, the known methods K-Means++ or Competitive Learning, can automatically assign each of the equipment batteries to one of the clusters of similarly operated equipment batteries, or equipment batteries having similar manifestations of the operating attribute under consideration.

A cluster of particularly stressed equipment batteries as a result of cluster analysis for an operating attribute under consideration is identified as the cluster of which the centroid is associated with an operating attribute value indicating the highest load of all centroids, and of which the centroid is associated with a function parameter of the history function indicating a highest degradation of all centroids. If such a cluster can be identified after a cluster analysis, a corresponding action is assigned to the associated operating attribute to reduce the stress load on the equipment batteries assigned to the cluster. Also none of the clusters may be identified as a result of this evaluation, namely if the centroid of none of the clusters is simultaneously associated with an operating attribute value indicating the highest stress of all centroids and associated with a function parameter of the history function indicating a highest degradation of all centroids.

The action is then signaled to the corresponding machines of the equipment batteries in order to advise a user of the battery-operated machine to operate the equipment battery more sparingly.

The stress factors indicated by the operating attributes may indicate, for example, stress-inducing conditions such as, for example, frequent operation at a high battery temperature while maintaining a high state of charge for an extended period of time. A corresponding stress-reducing action in this example would be to avoid a prolonged period of inactivity at high states of charge and simultaneously high ambient temperatures, and to perform charging to a sufficient state of charge of the equipment battery in a cooler environment, for example at night rather than during the day. Proposed in this regard are specific actions that are assigned to the identified stress factors and that directly or implicitly reduce the stress factors. (e.g. by changing the time of charging, a change in the stress factor temperature can be achieved, as environmental conditions change accordingly).

It may be provided that the action to be signaled is determined in dependence on a predefined assignment model in dependence on the relevant operating attribute that is associated with the identified cluster.

According to further embodiments, the battery-operated machine may correspond to a motor vehicle, a pedelec, a flight device, in particular a drone, a power tool, a consumer electronics device such as a mobile phone, an autonomous robot, and/or a household appliance.

According to a further aspect a device, in particular a central processing unit, is provided in a system, which device is in communication with a multiplicity of battery-operated machines that each have an equipment battery, and which is designed to provide an action for extending the service life of the equipment battery of the machine in a machine-specific manner, the device being designed to:

determine in each case a history function in dependence on time progressions of continuously provided, or received, operating variables for a multiplicity of particular equipment batteries, the respective history function indicating a progression of the state of health of the respective equipment battery, provide operating attributes in dependence on the time progressions of the continuously provided, or received, operating variables for each of the equipment batteries, the provided operating attributes being assigned to possible stress factors for the purpose of indicating a stress load, perform a cluster analysis for at least one of the operating attributes in an attribute space having operating attribute points that are each determined by the relevant operating attribute and by a respective function parameter of the history function that indicates a measure of the degradation, in particular a time gradient, for each of the equipment batteries, in order to identify a plurality of clusters of equipment batteries, for each operating attribute, identify the cluster of equipment batteries for which the relevant operating attribute of the centroid associated with the relevant cluster indicates the highest stress load and for which the function parameter of the centroid associated with the relevant cluster indicates the highest degradation among the clusters, for each operating attribute, signal to the machines associated with the identified cluster a stress-reducing action assigned to the relevant operating attribute.

According to a further aspect, there is provided a system comprising the above device, which is in communication with a multiplicity of battery operated machines that each have an equipment battery.

BRIEF DESCRIPTION OF THE DRAWINGS

Embodiments are explained in greater detail in the following on the basis of the appended drawings. There are shown.

DETAILED DESCRIPTION

In the following, the method according to the disclosure is described with reference to vehicle batteries, as batteries in a multiplicity of motor vehicles as battery-operated machines. In the motor vehicles, a data-based state-of-health model for the respective vehicle battery may be implemented in a control unit. The state-of-health model may be continuously updated, or retrained, in a central processing unit on the basis of operating variables of the vehicle batteries from the vehicle fleet.

The present method is applicable to unknown battery types for which no information on electrochemical design parameters or extensive ageing tests are available, and no electrochemical or hybrid, or data-based model, can be parameterized.

The above example is representative of a multiplicity of stationary or mobile battery-operated machines and devices that have an off-mains power supply such as, for example, vehicles (electric vehicles, pedelecs, etc.), installations, power tools, household appliances, IOT devices, building power supplies, flying devices, in particular drones, autonomous robots and consumer electronics devices, in particular mobile phones, and the like, which are connected to a central processing unit (cloud) via a corresponding communication link (e.g. LAN, Internet).

Figure 1:
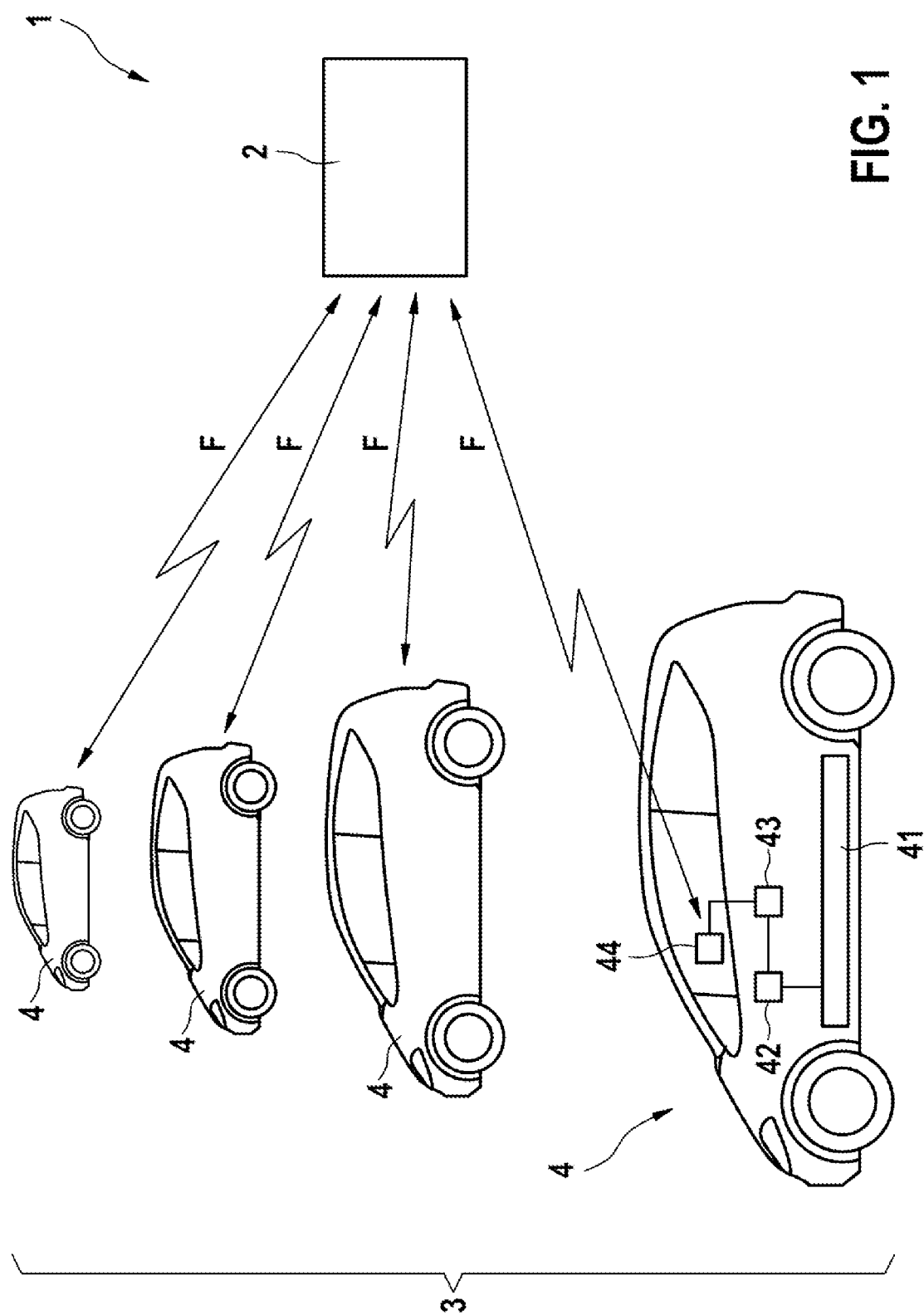
FIG. 1 shows a schematic representation of a system for providing driver-specific and vehicle-specific load variables for a vehicle battery, based on fleet data.

FIG. 1 shows a system 1 for collecting fleet data in a central processing unit 2 for the purpose of creating a state-of-health model. The state-of-health model is used to determine a state of health of an electrical energy storage device in a motor vehicle. FIG. 1 shows a vehicle fleet 3 comprising a plurality of motor vehicles 4.

One of the motor vehicles 4 in FIG. 1 is represented in greater detail. The motor vehicles 4 each have a vehicle battery 41 as a rechargeable electrical energy storage device, an electric drive motor 42 and a control unit 43. The control unit 43 is connected to a communication module 44 that is suitable for transmitting data between the respective motor vehicle 4 and a central processing unit (a so-called cloud).

The motor vehicles 4 send to the central processing unit 2 operating variables F indicating at least variables on which the state of health of the vehicle battery depends. In the case of a vehicle battery, the operating variables F may indicate an instantaneous battery current, an instantaneous battery voltage, an instantaneous battery temperature and an instantaneous state of charge (SOC), both at pack, module and/or cell level. The operating variables F are acquired in a fast time pattern of 0.1 Hz to 100 Hz, and may be transmitted in uncompressed and/or compressed form to the central processing unit 2 on a regular basis. For example, the time series may be transmitted to the central processing unit 2 in blocks at intervals of 10 min to several hours.

In the central processing unit 2, a state-of-health model may be implemented that ascertains a state-of-health from an empirical evaluation of the operating variables F. This state-of-health model may determine a state-of-health value in suitable operating states of the vehicle battery 41 such as, for example, during a charging process or a discharging process, by means of conventional methods such as, for example, ascertainment of the charge supply or charge drain during a particular voltage excursion of the battery voltage, or during a particular change of a state of charge and the like. Alternatively or additionally, a state-of-health value may be achieved by monitoring a change in internal resistance (to ascertain an SOH-R) according to a method known per se. Other embodiments of the state-of-health model are also possible. For example, data-based state-of-health models may also be used to linearize the progression of the state-of-health values.

Furthermore, one or more operating attributes may be generated from the operating variables, which operating attributes characterize the operation of the vehicle battery over its respective operating period since the time of commissioning, and which may represent a stress factor depending on the individual vehicle usage. The operating attributes are quantified and thus, depending on the magnitude of the value, indicate a stress factor that represents a particular load on the vehicle battery 41. For example, calendar ageing may be assigned to a value resulting from the level of temperature, the level of state of charge, and the length of time in which these conditions exist. Assessments are also possible based on known effect chains, for example derived from Arrhenius approaches that physically describe battery degradation.

Such stress factors may be, for example, calendar ageing with a high state of charge and high temperature, cyclic ageing corresponding to a high frequency of charging and discharging processes, and a frequency of fast charging with high amperages. In particular, the stress factors may be a frequency of fast charging cycles with high charging currents, frequent high discharging currents due to high vehicle acceleration or high vehicle speeds, frequent high current flows at high temperatures, the frequency of charging and discharging cycles at very high states of charge (>80% of the maximum state of charge) or at very low states of charge (<20% of the maximum state of charge), frequent discharging until the end-of-discharge voltage is reached (low SoC of, for example, 20%) and the like.

Stress factors are already known before commissioning based on modeled effect chains.

Figure 2:
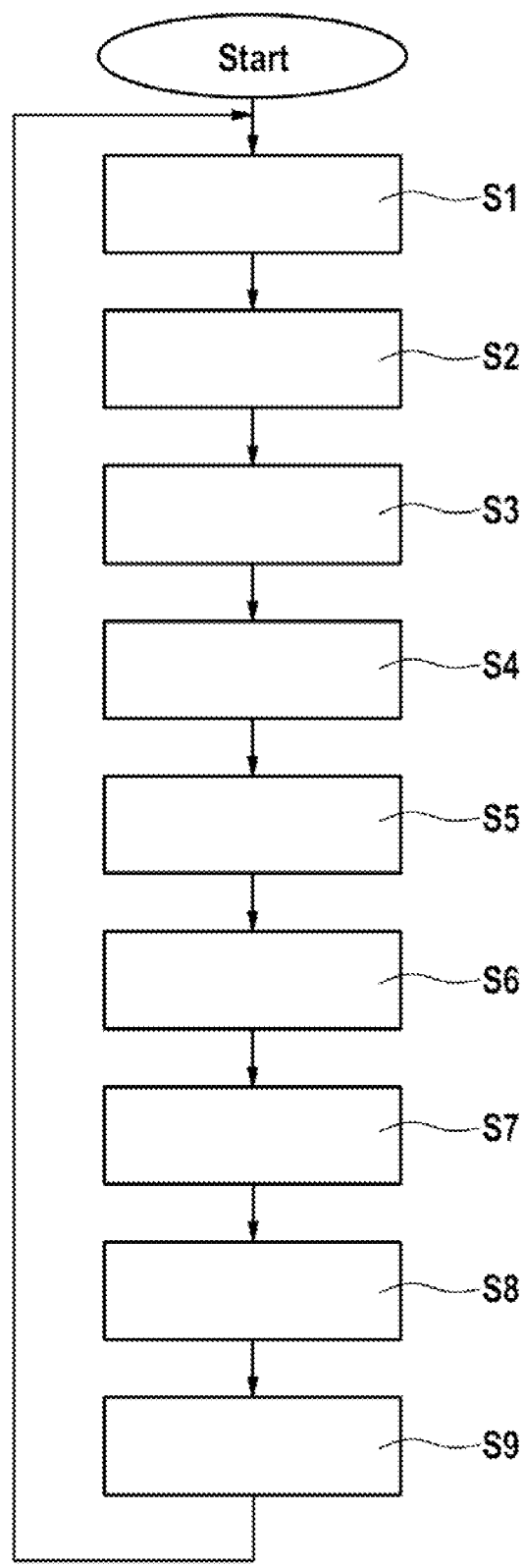
FIG. 2 shows a flow diagram illustrating a method for signaling an action for the operation of a motor vehicle.

FIG. 2 shows a flow diagram illustrating a method for ascertaining an action for extending the service life of the vehicle battery, in particular actions that help to achieve a predefined target service life in the case of an already stressed vehicle battery 41.

The method may be executed in the central processing unit 2 for each of the motor vehicles 4 of the fleet 3. Alternatively, the method may also be performed in the motor vehicles 4 if the state-of-health model and fleet data are implemented in the motor vehicles 4. Available to the central processing unit 2 for this purpose are the time series of the operating variables for each evaluation period and corresponding progressions of the ageing states of the vehicle batteries 41 of the motor vehicles 4. Alternatively, the method described below may also be performed in the motor vehicles 4 if a corresponding state-of-health model is provided in the motor vehicle.

In step S1, in the central processing unit 2, the time series of the operating variables F are received on a regular basis from a multiplicity of vehicles 4.

In step S2, the progressions of the operating variable may be suitably filtered and/or pre-processed, for example using outlier elimination and filtering to check the plausibility of the data obtained.

In step S3, at regular evaluation time-points, the operating progressions of the operating variables F for each of the multiplicity of vehicles are analyzed, and a state-of-health value is estimated with the aid of an empirical state-of-health model. This can be done, for example, by the methods described above for ascertaining a state-of-health based on the capacity maintenance rate or on an internal resistance change. The operating variables are evaluated at preferably periodic evaluation intervals, with the empirical state-of-health model ascertaining the state-of-health values of the relevant vehicle battery 41 at irregular ageing time-points. For each ascertainment of a state-of-health value, a data point may be generated that assigns the ascertained state-of-health value to an ageing time-point (age of the equipment battery since commissioning) of the relevant equipment battery. Thus, for example, a set of data points may be ascertained for a vehicle battery, as represented, for example, in the diagram of FIG. 3. The state-of-health value ascertained with the aid of the empirical state-of-health model is generally scattered and is present in time segments that are not continuous, as can be seen in FIG. 3.

In a subsequent step S4, the data points are fitted to a statistical model of a history function with the aid of a data-driven model. This model may be predefined, for example, as a linear history function. This reduces the inaccuracy in ascertaining the state-of-health values by eliminating, or reducing, the scatter of the data points. For example, a linear history function may be parameterized, in particular by minimizing a residual by least-squares method or the like. In general, nonlinear parametric methods as well as nonparametric models, such as Gaussian process methods, may also be used as history functions.

Figure 3:
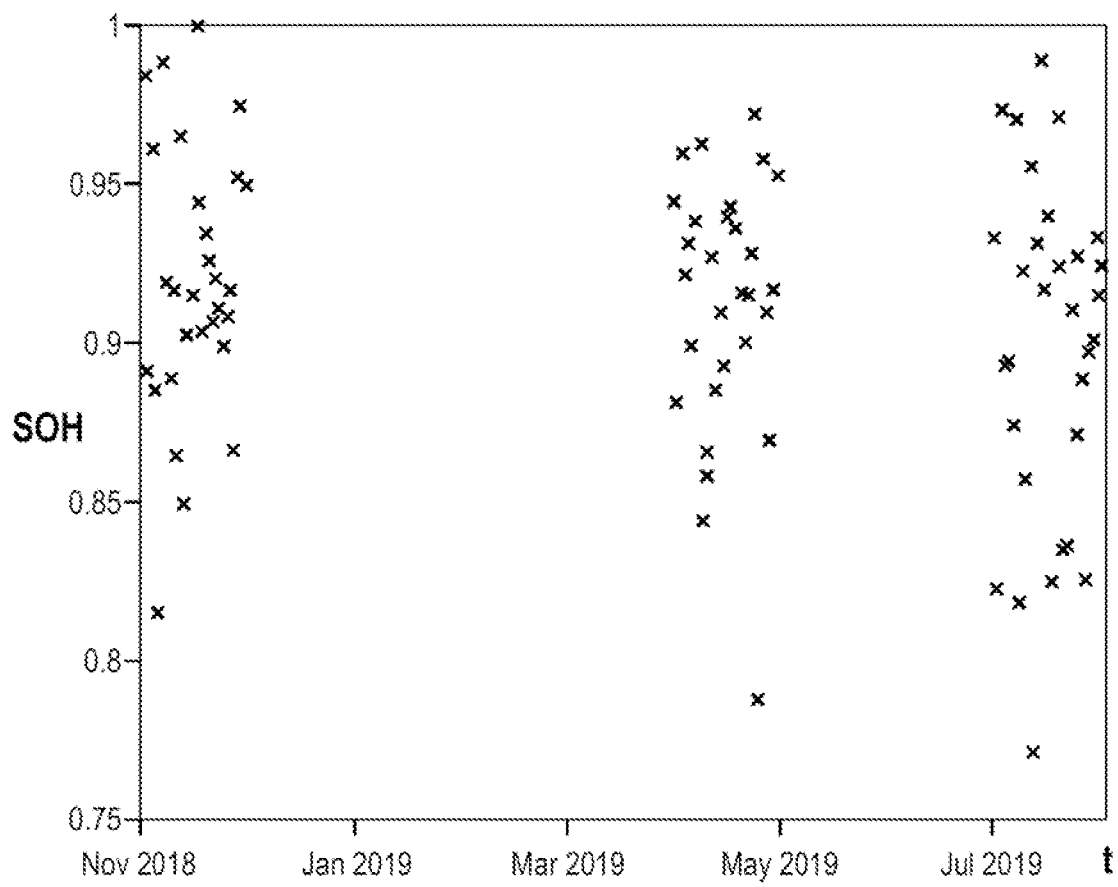
FIG. 3 shows a representation of state-of-health values over the ageing period.
Figure 4:
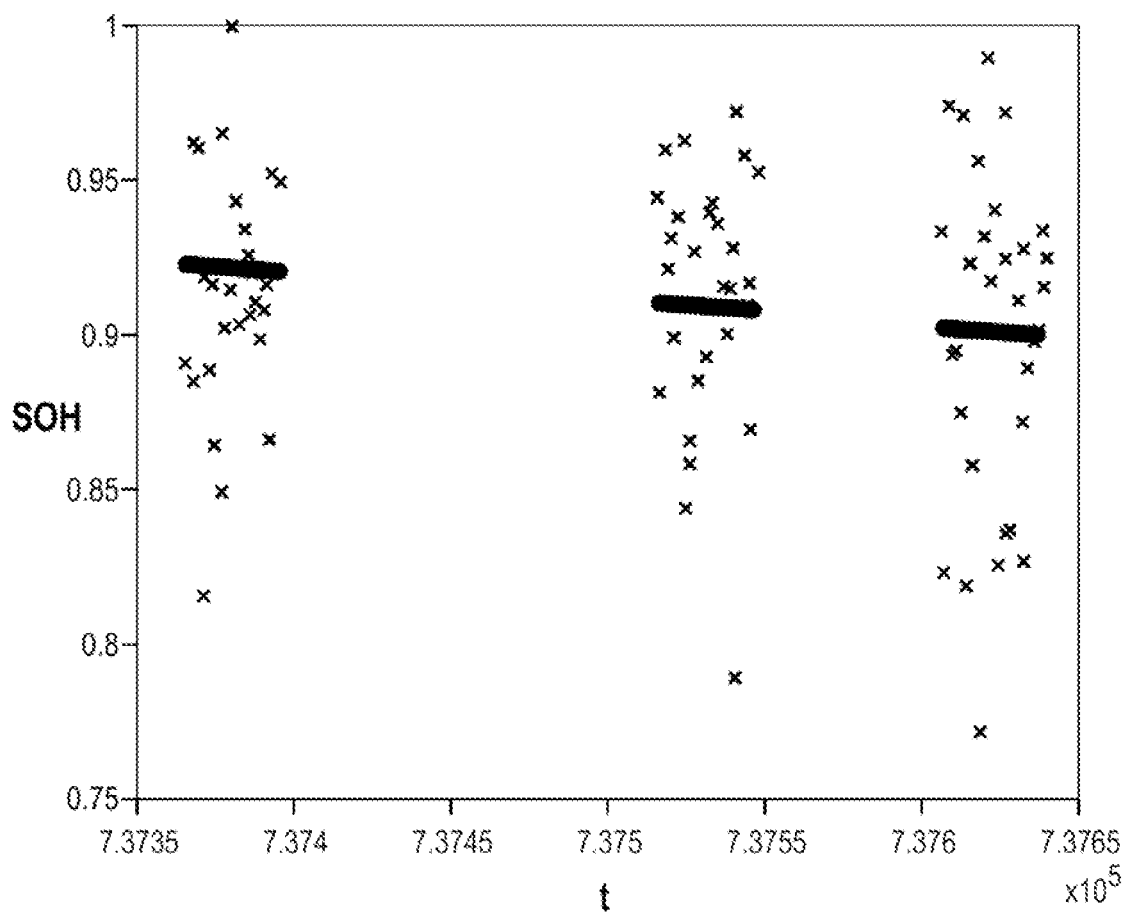
FIG. 4 shows a representation of a fitted history function for the state-of-health values of FIG. 3.

FIG. 4 shows an example of a fitted linearized history function for the data points of FIG. 3. A function parameter that indicates a measure of degradation can be determined from the fitted history function. In the case of a linear history function, this function parameter may be a gradient of the history function.

Furthermore, in step S5, the progressions of the operating variables F for the vehicle batteries are analyzed in order to quantify one or more characterizing operating attributes for each vehicle battery, as described above. A respective value of the one or more operating attributes indicates, in each case, the extent to which the usage characterized by the operating attribute has stressed the respective vehicle battery.

In the central processing unit 2, the above steps are executed for a multiplicity of vehicle batteries 41 such that, for the multiplicity of vehicle batteries, there are available both one or more operating attributes characterizing a usage or an operating behavior of the vehicle battery 41, and the parameterized history function.

In a subsequent step S6, a cluster analysis is then effected, which analyzes the operating attributes and the gradient of the history function or, in the case of nonlinear history functions, the representative function parameter indicating a degradation (or a model property after parameterization).

The cluster analysis is performed separately for each operating attribute. An operating attribute point is determined for each vehicle battery, which results from the value of the relevant operating attribute and the gradient of the history function of the relevant vehicle battery. This results in an operating attribute space from the operating attribute points of the multiplicity of vehicle batteries.

The cluster analysis is performed on the basis of the distribution of the operating attribute points of the multiplicity of equipment batteries in the attribute space. The cluster analysis yields clusters, each of which is determined by the associated centroid. Each centroid is associated with a quantified operating attribute and a value of the function parameter indicating a measure of a degradation. The cluster analysis, which may use, for example, the known methods K-Means++ or Competitive Learning, may automatically assign each of the equipment batteries to one of the clusters of similarly operated vehicle batteries, or vehicle batteries having similar manifestations of the operating attribute under consideration.

A cluster of particularly stressed equipment batteries as a result of cluster analysis for an operating attribute under consideration is identified as the cluster of which the centroid is associated with an operating attribute value indicating the highest load of all centroids, and of which the centroid is associated with a function parameter of the history function indicating a highest degradation of all centroids. If such a cluster can be identified after a cluster analysis, a corresponding action is assigned to the associated operating attribute to reduce the stress load on the equipment batteries assigned to the cluster. Also none of the clusters may be identified as a result of this evaluation, namely if the centroid of none of the clusters is simultaneously associated with an operating attribute value indicating the highest stress of all centroids and associated with a function parameter of the history function indicating a highest degradation of all centroids. Indeed, in this case, the qualitative stress factor influence would not be successfully verified on the basis of the known physical effect chains.

In step S7, a cluster is identified denoting vehicle batteries that are exposed to a stress factor that causes high degree state-of-health degradation.

Figure 5:
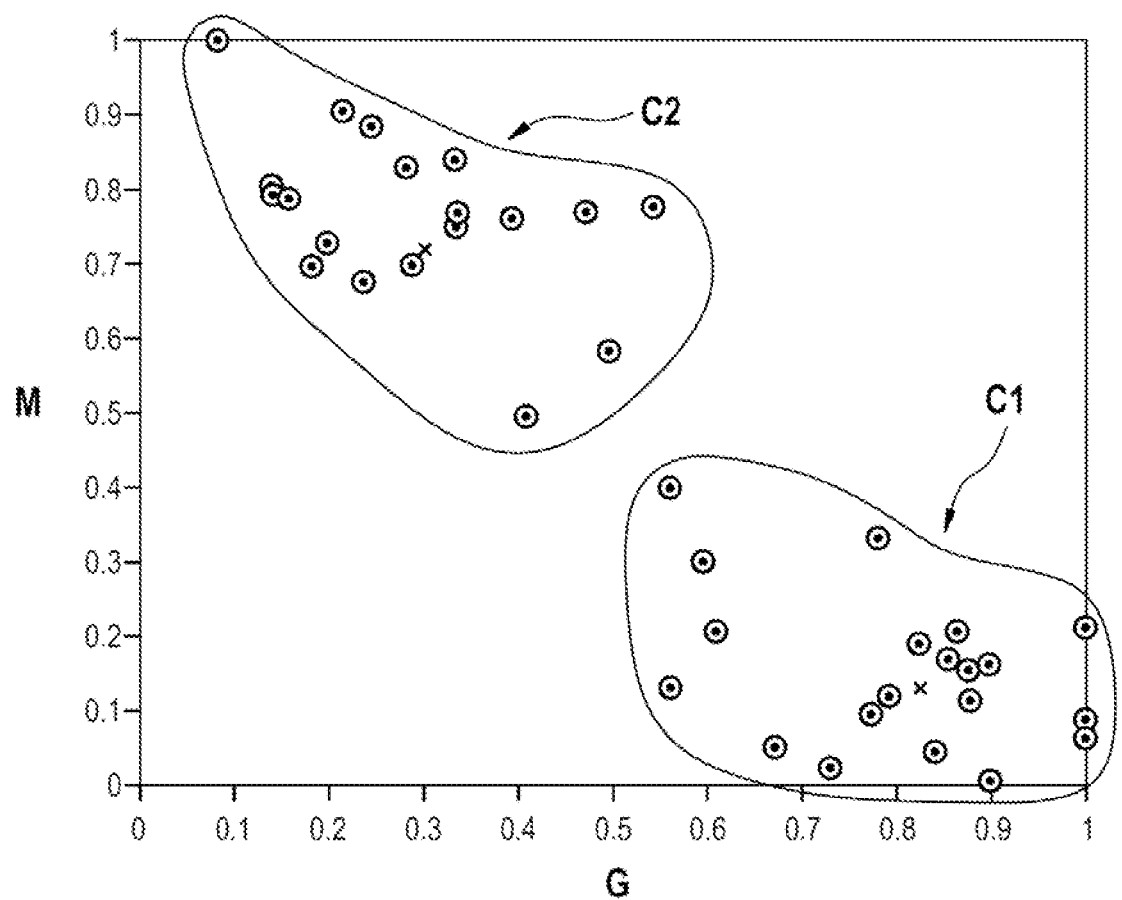
FIG. 5 shows an example of a cluster representation of an operating attribute space for an operating attribute and a gradient of the history function.

For example, in FIG. 5, for two dimensions of an exemplary attribute space, an operating attribute M (y-axis, higher y-values represent higher degradation/load) is plotted against a normalized gradient G of the history function (x-axis, higher x-values represent lower degradation/load). Two clusters can be seen. A first cluster C1 with a function parameter that signals a small degree of battery degradation, using the example of the small gradient of the history function and an operating attribute M that, due to its intensity/value, represents a small load on the vehicle battery, and a second cluster C2 with a high load on the vehicle battery 41, with a function parameter that signals a large degree of battery degradation, using the example of the large gradient of the history function and an operating attribute that, due to its intensity/value, represents a large load on the vehicle battery. Here, the relationship between increased battery degradation and the qualitative stress factor influence can be verified with sufficient evidence on the basis of known physical effect chains.

In step S8, an action is assigned to the operating attribute of the identified cluster with the aid of a rule-based assignment model.

In step S9, the respective action is now signaled to the corresponding machines of the vehicle batteries represented by the identified cluster. In this way, users of the relevant battery-operated machines can be advised to operate the vehicle battery more sparingly.

For each operating attribute that can represent a stress factor, rule-based actions are defined according to an assignment model (e.g. lookup table) on the basis of domain knowledge of how the stress factor can be reduced by slightly modified user behavior.

In this way, it is possible to automatically suggest a suitable action to a driver, on the basis of the driver's cluster assignment, in order to extend the service life of the vehicle battery 41. It is thus possible, for example, that an action suggested to a driver who frequently charges their vehicle battery 41 at a fast charging station at a high battery temperature is to reduce fast charging operations, provided that it suits the driver's range requirements. In this case, for example, gentle overnight charging may be sufficient to safely meet all daily driving requirements while extending the service life of the battery.

Instead of signaling an action to the driver, the measures may, if necessary, be implemented automatically in the vehicle, for example by limiting the charge consumption during a charging process or limiting the maximum discharging current or changing the derating operating strategy.

Also, for example in the case of high calendar ageing (high state of charge at high temperature for a prolonged period of time), the user may be advised either not to fully charge the battery in respect of the state of charge, if this is compatible with the driver's wishes in respect of usage, or alternatively to charge the battery at a later point in time, when there are more favorable ambient conditions, such as a lower temperature, for gentle charging.

What is claimed is:

1. A method, which is computer-implemented, for operating a system including a central processor that is in communication with a plurality of battery-operated machines that each have an equipment battery, and for providing an action for extending a service life of the equipment batteries of the plurality of battery-operated machines in a machine-specific manner, the method comprising:
   determining, for each respective equipment battery in a plurality of the equipment batteries, a respective history function of a state of health of the respective equipment battery depending on time progressions of operating variables that are one of continuously-provided and continuously-received, the respective history function indicating a progression of the state of health of the respective equipment battery;
   providing operating attributes depending on the time progressions of the operating variables for each of the plurality of equipment batteries, the operating attributes being assigned to stress factors to indicate a stress load on the respective equipment battery;
   determining a corresponding normalized time gradient of each of the determined history functions;
   plotting operating attribute points in a corresponding attribute space for each of the operating attributes for each equipment battery of the plurality of equipment batteries, the attribute space including values of the corresponding operating attribute plotted against the corresponding normalized time gradient of the history function to form the plotted operating attribute points;
   performing a cluster analysis by clustering the plotted operating attribute points into a plurality of clusters;
   identifying a corresponding centroid for each cluster of the plurality of clusters, each centroid representing a value of the corresponding operating attribute and a value of the corresponding normalized time gradient;
   identifying, for each respective operating attribute of the operating attributes, a respective cluster of the plurality of clusters for which the centroid indicates (i) a highest stress load based on the value of the corresponding operating attribute, and (ii) for which the value of the corresponding normalized time gradient indicates a highest degradation; and
   signaling, for each respective operating attribute of the operating attributes, to machines of the plurality of battery-operated machines that are associated with the identified cluster a stress-reducing action assigned to the respective operating attribute.

2. The method according to claim 1, the performing the cluster analysis further comprising:
   performing the cluster analysis using one of (i) K-means++ and (ii) competitive learning.

3. The method according to claim 1, the determining, for each respective equipment battery in the plurality of equipment batteries, the respective history function further comprising:
   ascertaining state-of-health values of the respective equipment battery, depending on the operating variables, using a state-of-health model to determine data points, each of the data points assigning an ascertained state-of-health value to an ageing time-point; and
   parameterizing the respective history function to fit the history function to the data points.

4. The method according to claim 1 further comprising:
   determining the stress-reducing action to be signaled depending on a predefined assignment model and the identified respective cluster.

5. The method according to claim 1, wherein the operating variables indicate a battery current, a battery voltage, a battery temperature, and a state of charge.

6. The method according to claim 1, wherein the operating attributes, which indicate stress factors, include (i) a calendar ageing with a first state of charge and first temperature, (ii) a cyclic ageing corresponding to a first frequency of charging and discharging processes, (iii) and a frequency of charging processes with first amperages.

7. The method according to claim 1, the plurality of battery-operated machines include at least one of (i) a motor vehicle, (ii) a pedelec, (iii) a flight device, (iv) a drone, (v) a power tool, (vi) a consumer electronics device, (vii) a mobile phone, (viii) an autonomous robot, and (ix) a household appliance.

8. The method according to claim 1, wherein the method is carried out by a computer program that is executed by at least one data processing device.

9. The method according to claim 8, wherein the computer program is stored on a non-transitory machine-readable storage medium.

10. The method according to claim 3, wherein the respective history function is a linear history function.

11. The method according to claim 6, wherein the operating attributes are correspondingly quantified to indicate by their value a load on at least one of the plurality of equipment batteries.

12. The method according to claim 1, wherein the signaled stress-reducing action is to reduce fast charging operations of the respective equipment battery and to use overnight charging to charge the respective equipment battery.

13. The method according to claim 1, wherein the signaled stress-reducing action is an automatic limit of a charge consumption during a charging process of the respective equipment battery.

14. The method according to claim 1, wherein the signaled stress-reducing action is an automatic limit of a maximum discharging current of the respective equipment battery.

15. The method according to claim 1, wherein the values of each corresponding operating attribute indicate an extent to which a usage characterized by the corresponding operating attribute has stressed the respective equipment battery.

16. A device of a system, which is in communication with a plurality of battery-operated machines that each have an equipment battery, for providing an action for extending a service life of the equipment batteries of the plurality of battery-operated machines in a machine-specific manner, the device being configured to:
determine, for each respective equipment battery in a plurality of the equipment batteries, a respective history function of a state of health of the respective equipment battery depending on time progressions of operating variables that are one of continuously-provided and continuously-received, the respective history function indicating a progression of the state of health of the respective equipment battery;
provide operating attributes depending on the time progressions of the operating variables for each of the plurality of equipment batteries, the operating attributes being assigned to stress factors to indicate a stress load on the respective equipment battery;
determine a corresponding normalized time gradient of each of the determined history functions;
plot operating attribute points in a corresponding attribute space for each of the operating attributes for each equipment battery of the plurality of equipment batteries, the attribute space including values of the corresponding operating attribute plotted against the corresponding normalized time gradient of the history function to form the plotted operating attribute points;
perform a cluster analysis by clustering the plotted operating attribute points into a plurality of clusters;
identify a corresponding centroid for each cluster of the plurality of clusters, each centroid representing a value of the corresponding operating attribute and a value of the corresponding normalized time gradient;
identify, for each respective operating attribute of the operating attributes, a respective cluster of the plurality of clusters for which the centroid indicates (i) a highest stress load based on the value of the corresponding operating attribute, and (ii) for which the value of the corresponding normalized time gradient indicates a highest degradation; and
signal, for each respective operating attribute of the operating attributes, to machines of the plurality of battery-operated machines that are associated with the identified cluster a stress-reducing action assigned to the respective operating attribute.

17. The device according to claim 16, wherein the device is central processor.

18. The device according to claim 16, wherein the values of each corresponding operating attribute indicate an extent to which a usage characterized by the corresponding operating attribute has stressed the respective equipment battery.

19. A system comprising:
a plurality of battery-operated machines that each have an equipment battery; and
a central processor configured to provide actions to extend a service life of the equipment battery of each of the plurality of battery-operated machines in a machine-specific manner, the central processor being is in communication with the plurality of battery-operated machines, the central processor being configured to:
determine, for each respective equipment battery in a plurality of the equipment batteries, a respective history function of a state of health of the respective equipment battery depending on time progressions of operating variables that are one of continuously-provided and continuously-received, the respective history function indicating a progression of the state of health of the respective equipment battery;
provide operating attributes depending on the time progressions of the operating variables for each of the plurality of equipment batteries, the operating attributes being assigned to stress factors to indicate a stress load on the respective equipment battery;
determine a corresponding normalized time gradient of each of the determined history functions;
plot operating attribute points in a corresponding attribute space for each of the operating attributes for each equipment battery of the plurality of equipment batteries, the attribute space including values of the corresponding operating attribute plotted against the corresponding normalized time gradient of the history function to form the plotted operating attribute points;
perform a cluster analysis by clustering the plotted operating attribute points into a plurality of clusters;
identify a corresponding centroid for each cluster of the plurality of clusters, each centroid representing a value of the corresponding operating attribute and a value of the corresponding normalized time gradient;

identify, for each respective operating attribute of the operating attributes, a respective cluster of the plurality of clusters for which the centroid indicates (i) a highest stress load based on the value of the corresponding operating attribute, and (ii) for which the value of the corresponding normalized time gradient indicates a highest degradation; and signal, for each respective operating attribute of the operating attributes, to machines of the plurality of battery-operated machines that are associated with the identified cluster a stress-reducing action assigned to the respective operating attribute.

20. The system according to claim 19, wherein the values of each corresponding operating attribute indicate an extent to which a usage characterized by the corresponding operating attribute has stressed the respective equipment battery.

* * * * *